United States Patent
Sun et al.

(10) Patent No.: US 10,468,235 B2
(45) Date of Patent: Nov. 5, 2019

(54) PLASMA SPRAY COATING ENHANCEMENT USING PLASMA FLAME HEAT TREATMENT

(71) Applicant: Applied Materials, Inc., Santa Clara, CA (US)

(72) Inventors: Jennifer Y. Sun, Mountain View, CA (US); Yikai Chen, Santa Clara, CA (US); Biraja P. Kanungo, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 164 days.

(21) Appl. No.: 14/462,271

(22) Filed: Aug. 18, 2014

(65) Prior Publication Data

US 2015/0075714 A1    Mar. 19, 2015

Related U.S. Application Data

(60) Provisional application No. 61/879,549, filed on Sep. 18, 2013.

(51) Int. Cl.
  *C23C 4/10*  (2016.01)
  *C23C 4/18*  (2006.01)
  (Continued)

(52) U.S. Cl.
  CPC .......... *H01J 37/32495* (2013.01); *C23C 4/10* (2013.01); *C23C 4/11* (2016.01);
  (Continued)

(58) Field of Classification Search
  CPC ................. C23C 4/127; C23C 4/105
  (Continued)

(56) References Cited

U.S. PATENT DOCUMENTS 4,371,570 A * 2/1983 Goebel .................... F02C 7/30
                                                                148/240
5,853,815 A    12/1998 Muehlberger
(Continued)

FOREIGN PATENT DOCUMENTS

CN          101772589         7/2010
CN          102084020         6/2011
(Continued)

OTHER PUBLICATIONS

Kitamura, Structural, mechanical and erosion properties of yttrium oxide coatings by axial suspension plasma spraying for electronic applications, Journal of Thermal Spray Technology, 2011, vol. 20(1-2). p. 170-185.*

(Continued)

*Primary Examiner* — Dah-Wei D. Yuan
*Assistant Examiner* — Nga Leung V Law
(74) *Attorney, Agent, or Firm* — Lowenstein Sandler LLP (57) ABSTRACT

A method for forming a plasma resistant ceramic coating on an article includes placing the article into a chamber or spray cell of a plasma spraying system. A ceramic powder is then fed into the plasma spraying system at a powder feed rate, and a plasma resistant ceramic coating is deposited onto at least one surface of the article in a plasma spray process by the plasma spray system. The plasma spray system is then used to perform an in-situ plasma flame heat treatment of the plasma resistant ceramic coating to form crust on the plasma resistant ceramic coating.

20 Claims, 4 Drawing Sheets

(51) Int. Cl.
*C23C 4/11* (2016.01)
*C23C 4/134* (2016.01)
*H01J 37/32* (2006.01)

(52) U.S. Cl.
CPC .............. *C23C 4/134* (2016.01); *C23C 4/18* (2013.01); *H01J 37/32477* (2013.01); *Y10T 428/24967* (2015.01); *Y10T 428/249981* (2015.04)

(58) Field of Classification Search
USPC .................................................. 427/446, 453
See application file for complete search history.

(56) References Cited

U.S. PATENT DOCUMENTS

| | | | |
|---|---|---|---|
| 6,296,909 B1 * | 10/2001 | Spitsberg | C04B 41/009 427/452 |
| 6,756,082 B1 * | 6/2004 | Subramanian | C23C 14/083 427/248.1 |
| 7,670,688 B2 * | 3/2010 | Kaushal | H01J 37/32467 118/723 R |
| 7,696,117 B2 | 4/2010 | Sun et al. | |
| 8,034,734 B2 | 10/2011 | Sun et al. | |
| 8,206,829 B2 | 6/2012 | Sun et al. | |
| 8,367,227 B2 | 2/2013 | Sun et al. | |
| 9,034,199 B2 | 5/2015 | Duan et al. | |
| 9,090,046 B2 | 7/2015 | Sun et al. | |
| 9,212,099 B2 | 12/2015 | Sun et al. | |
| 2005/0153069 A1 | 7/2005 | Tapphorn et al. | |
| 2006/0222777 A1 | 10/2006 | Skoog et al. | |
| 2007/0054092 A1 | 3/2007 | Harada et al. | |
| 2008/0029032 A1 | 2/2008 | Sun et al. | |
| 2008/0108225 A1 | 5/2008 | Sun et al. | |
| 2008/0113218 A1 | 5/2008 | Schlichting et al. | |
| 2008/0213496 A1 * | 9/2008 | Sun | C23C 4/105 427/453 |
| 2008/0264564 A1 | 10/2008 | Sun et al. | |
| 2008/0264565 A1 | 10/2008 | Sun et al. | |
| 2009/0036292 A1 | 2/2009 | Sun et al. | |
| 2009/0183835 A1 | 7/2009 | Furuse et al. | |
| 2009/0214825 A1 * | 8/2009 | Sun | C23C 4/11 428/141 |
| 2009/0252945 A1 | 10/2009 | Refke et al. | |
| 2010/0119843 A1 | 5/2010 | Sun et al. | |
| 2010/0124616 A1 | 5/2010 | Rosenzweig et al. | |
| 2010/0129670 A1 | 5/2010 | Sun et al. | |
| 2010/0160143 A1 | 6/2010 | Sun et al. | |
| 2011/0198034 A1 | 8/2011 | Sun et al. | |
| 2012/0034469 A1 | 2/2012 | Sun et al. | |
| 2012/0104703 A1 | 5/2012 | Sun et al. | |
| 2012/0125488 A1 | 5/2012 | Sun et al. | |
| 2013/0216783 A1 | 8/2013 | Duan et al. | |
| 2013/0216821 A1 | 8/2013 | Sun et al. | |
| 2013/0224498 A1 | 8/2013 | Sun et al. | |
| 2013/0273313 A1 | 10/2013 | Sun et al. | |
| 2013/0273327 A1 | 10/2013 | Sun et al. | |
| 2013/0284373 A1 | 10/2013 | Sun et al. | |
| 2013/0288037 A1 | 10/2013 | Sun et al. | |
| 2014/0030486 A1 | 1/2014 | Sun et al. | |
| 2014/0030533 A1 | 1/2014 | Sun et al. | |
| 2014/0154465 A1 | 6/2014 | Sun et al. | |
| 2014/0302247 A1 * | 10/2014 | Inaba | C23C 4/10 427/493 |
| 2014/0349073 A1 | 11/2014 | Sun et al. | |
| 2014/0363596 A1 | 12/2014 | Sun et al. | |
| 2014/0377504 A1 | 12/2014 | Sun et al. | |
| 2015/0021324 A1 | 1/2015 | Sun et al. | |
| 2015/0024155 A1 | 1/2015 | Sun et al. | |
| 2015/0075714 A1 | 3/2015 | Sun et al. | |
| 2015/0079370 A1 | 3/2015 | Sun et al. | |
| 2015/0133285 A1 | 5/2015 | Sun et al. | |
| 2015/0158775 A1 | 6/2015 | Sun et al. | |
| 2015/0218057 A1 | 8/2015 | Duan et al. | |
| 2015/0270108 A1 | 9/2015 | Sun et al. | |
| 2015/0299050 A1 | 10/2015 | Sun et al. | |
| 2015/0307982 A1 | 10/2015 | Firouzdor et al. | |
| 2015/0311043 A1 | 10/2015 | Sun et al. | |
| 2015/0311044 A1 | 10/2015 | Sun et al. | |
| 2015/0321964 A1 | 11/2015 | Sun et al. | |
| 2015/0329430 A1 | 11/2015 | Sun et al. | |
| 2015/0329955 A1 | 11/2015 | Sun et al. | |

FOREIGN PATENT DOCUMENTS

| | | | |
|---|---|---|---|
| JP | 2007-217779 | 8/2007 | |
| JP | 2009-161846 | 7/2009 | |
| JP | 2012-067364 | 4/2012 | |
| JP | WO 2013065339 A1 * | 5/2013 | ............... C23C 4/10 |
| JP | 2013-124378 A | 6/2013 | |
| TW | 200946331 | 11/2009 | |
| TW | 201319319 | 5/2013 | |
| WO | WO2013126466 A1 | 8/2013 | |
| WO | WO2013155220 A1 | 10/2013 | |
| WO | WO2013162909 A1 | 10/2013 | |
| WO | WO2014018830 A1 | 1/2014 | |
| WO | WO2014018835 A1 | 1/2014 | |
| WO | WO20140190211 | 11/2014 | |
| WO | WO20140197203 | 12/2014 | |
| WO | WO20140205212 | 12/2014 | |
| WO | WO20150009745 | 1/2015 | |
| WO | WO20150013070 | 1/2015 | |
| WO | WO20150042196 | 3/2015 | |
| WO | WO20150073458 | 5/2015 | |
| WO | WO20150164263 | 10/2015 | |
| WO | WO20150164638 | 10/2015 | |
| WO | WO2015175987 A1 | 11/2015 | |
| WO | WO20150171801 | 11/2015 | |

OTHER PUBLICATIONS

International Search Report of the International Searching Authority dated Dec. 22, 2014 in International Application No. PCT/US2014/056169.

Smith, Mark F. et al., "Very Low Pressure Plasma Spray—A Review of an Emerging Technology in the Thermal Spray Community", Coatings, 2011, pp. 117-132, Open Access article, Basel, Switzerland.

* cited by examiner

FIG. 6

PLASMA SPRAY COATING ENHANCEMENT USING PLASMA FLAME HEAT TREATMENT

RELATED APPLICATIONS

This patent application claims the benefit under 35 U.S.C. § 119(e) of U.S. Provisional Application No. 61/879,549, filed Sep. 18, 2013.

TECHNICAL FIELD

Embodiments of the present disclosure relate, in general, to ceramic coated articles and to a process for plasma spraying a ceramic coating onto chamber components.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects.

As device geometries shrink, susceptibility to defects increases and particle contaminant requirements become more stringent. Accordingly, as device geometries shrink, allowable levels of particle contamination may be reduced. To minimize particle contamination introduced by plasma etch and/or plasma clean processes, chamber materials have been developed that are resistant to plasmas. Different materials provide different material properties, such as plasma resistance, rigidity, flexural strength, thermal shock resistance, and so on. Also, different materials have different material costs. Accordingly, some materials have superior plasma resistance, other materials have lower costs, and still other materials have superior flexural strength and/or thermal shock resistance.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the disclosure are directed to a process for coating an article with a ceramic coating and to performing a plasma flame heat treatment on the ceramic coating. The processes disclosed herein provide improved plasma resistance performance for chamber components with reduced processing time and lower cost than conventional plasma resistant coatings.

In one embodiment, an article is positioned with reference to a plasma spraying system. Ceramic powder is fed into the plasma spraying system at a powder feed rate, and the plasma spraying system deposits a plasma resistant ceramic coating on at least one surface of the article in a plasma spray process. The plasma spray system then performs an in-situ plasma flame heat treatment of the plasma resistant ceramic coating to form a crust on the plasma resistant ceramic coating. In some instances, the plasma flame heat treatment is superior to laser melting, spark plasma sintering and furnace heat treatments. Each of these other heat treatments are performed by equipment other than the plasma spray system used to deposit the plasma resistant ceramic coating. Accordingly, a lead time is increased for these other heat treatment processes. Additionally, transport of the article to the equipment for the other heat treatment processes increases a risk of contamination. In addition, laser melting may create vertical and horizontal cracks in the ceramic coating. Spark plasma sintering is limited in application to small sample sizes. Furnace heat treatment is not applicable for many types of substrates, such as for some metal substrates, electrostatic chucks, and so on.

By heat treating the plasma sprayed ceramic coating using the plasma flame heat treatment, a surface of the coating is reflowed to form a crust at the surface having reduced porosity and cracks. The heat-treated ceramic coating of the article may be highly resistant to plasma etching, and the article may have superior mechanical properties such as a high flexural strength and a high hardness. Performance properties of the coated ceramic article may include a high thermal capability, a long lifespan, and a low on-wafer particle and metal contamination.

When the terms "about" and "approximately" are used herein, these are intended to mean that the nominal value presented is precise within ±30%. The articles described herein may be structures that are exposed to plasma, such as chamber components for a plasma etcher (also known as a plasma etch reactor). For example, the articles may be walls, bases, gas distribution plates, shower heads, substrate holding frames, electrostatic chucks, rings, lids, nozzles, faceplates, selectivity modulation devices (SMDs) etc. of a plasma etcher, a plasma cleaner, a plasma propulsion system, and so forth.

Moreover, embodiments are described herein with reference to ceramic coated chamber components and other articles that may cause reduced particle contamination when used in a process chamber for plasma rich processes. However, it should be understood that the ceramic coated articles discussed herein may also provide reduced particle contamination when used in process chambers for other processes such as non-plasma etchers, non-plasma cleaners, chemical vapor deposition (CVD) chamber, physical vapor deposition (PVD) chamber, and so forth. Moreover, some embodiments are described with reference to specific plasma resistant ceramics. However, it should be understood that embodiments equally apply to other plasma resistant ceramics than those discussed herein.

Figure 1:
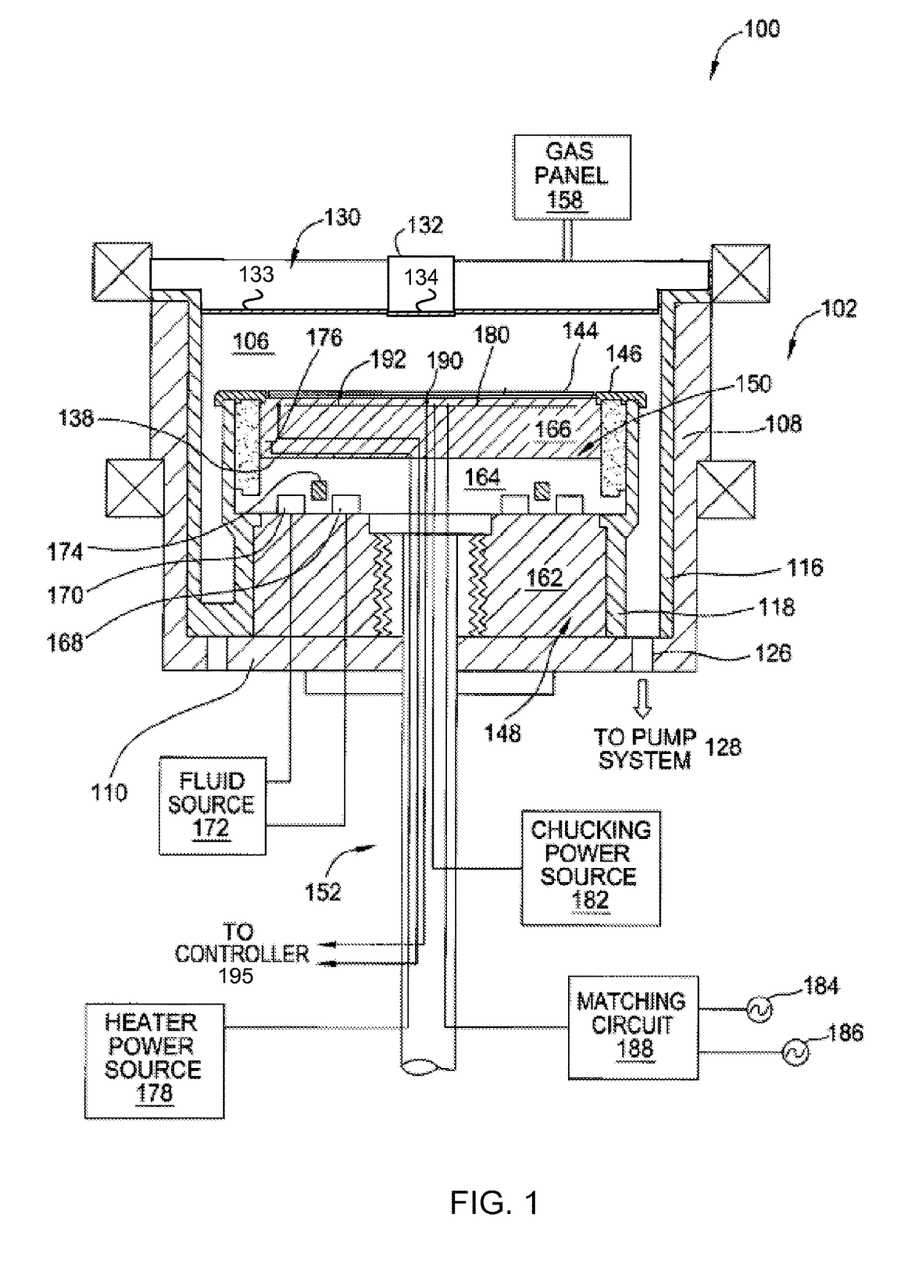
FIG. 1 depicts a sectional view of one embodiment of a processing chamber.

FIG. 1 is a sectional view of a processing chamber 100 (e.g., a semiconductor processing chamber) having one or more chamber components that are coated with a ceramic coating in accordance with embodiments of the present invention. The ceramic coating described in embodiments is a plasma-sprayed coating that has been heat treated using a plasma flame heat treatment by a torch of a plasma spraying system. The processing chamber 100 may be used for processes in which a corrosive plasma environment is provided. For example, the processing chamber 100 may be a chamber for a plasma etch reactor (also known as a plasma etcher), a plasma cleaner, and so forth. Examples of chamber components that may include a plasma resistant ceramic coating include a substrate support assembly 148, an electrostatic chuck (ESC) 150, a ring (e.g., a process kit ring or single ring), a chamber wall, a base, a gas distribution plate, a showerhead, a liner, a liner kit, a shield, a plasma screen, a flow equalizer, a cooling base, a chamber viewport, a chamber lid, a nozzle, process kit rings, a faceplate, an SMD, and so on.

The plasma resistant ceramic coating, which is described in greater detail below, is a rare earth oxide coating deposited by an atmospheric pressure plasma spraying (APPS) process. The plasma resistant ceramic coating may have a crust that has been formed by a plasma flame heat treatment process, in accordance with embodiments. The plasma resistant coating may include $Y_2O_3$ and $Y_2O_3$ based ceramics, $Y_3Al_5O_{12}$ (YAG), $Al_2O_3$ (alumina), $Y_4Al_2O_9$ (YAM), $YF_3$, SiC (silicon carbide) $Si_3N_4$ (silicon nitride), SiN (silicon nitride), AlN (aluminum nitride), $TiO_2$ (titania), $ZrO_2$ (zirconia), TiC (titanium carbide), ZrC (zirconium carbide), TiN (titanium nitride), $Y_2O_3$ stabilized $ZrO_2$ (YSZ), $Er_2O_3$ and $Er_2O_3$ based ceramics, $Gd_2O_3$ and $Gd_2O_3$ based ceramics, $Er_3Al_5O_{12}$ (EAG), $Gd_3Al_5O_{12}$ (GAG), $Nd_2O_3$ and $Nd_2O_3$ based ceramics, and/or a ceramic compound comprising $Y_4Al_2O_9$ and a solid solution of $Y_2O_3$—$ZrO_2$.

The plasma resistant coating may also be based on a solid solution formed by any of the aforementioned ceramics. With reference to the ceramic compound comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0-60 mol % and $Al_2O_3$ in a range of 0-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0-20 mol % and $Al_2O_3$ in a range of 10-20 mol %. In another embodiment, the ceramic compound can include $Y_2O_3$ in a range of 60-80 mol %, $ZrO_2$ in a range of 0-10 mol % and $Al_2O_3$ in a range of 20-40 mol %. In another embodiment, the ceramic compound can include $Y_2O_3$ in a range of 40-60 mol %, $ZrO_2$ in a range of 0-20 mol % and $Al_2O_3$ in a range of 30-40 mol %. In other embodiments, other distributions may also be used for the ceramic compound.

In one embodiment, an alternative ceramic compound that includes a combination of $Y_2O_3$, $ZrO_2$, $Er_2O_3$, $Gd_2O_3$ and $SiO_2$ is used for the protective layer. In one embodiment, the alternative ceramic compound can include $Y_2O_3$ in a range of 40-45 mol %, $ZrO_2$ in a range of 0-10 mol %, Er2O3 in a range of 35-40 mol %, $Gd_2O_3$ in a range of 5-10 mol % and SiO2 in a range of 5-15 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$.

Any of the aforementioned plasma resistant ceramic coatings may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. The ceramic coating allows for longer working lifetimes due to the plasma resistance of the ceramic coating and decreased on-wafer or substrate contamination. Beneficially, in some embodiments the ceramic coating may be stripped and re-coated without affecting the dimensions of the substrates that are coated.

In one embodiment, the processing chamber 100 includes a chamber body 102 and a lid 130 that enclose an interior volume 106. The lid 130 may have a hole in its center, and a nozzle 132 may be inserted into the hole. The chamber body 102 may be fabricated from aluminum, stainless steel or other suitable material. The chamber body 102 generally includes sidewalls 108 and a bottom 110. Sidewalls 108 and/or bottom 110 may include a plasma resistant ceramic coating.

An outer liner 116 may be disposed adjacent the sidewalls 108 to protect the chamber body 102. The outer liner 116 may be fabricated and/or coated with a plasma resistant ceramic coating. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 130 may be supported on the sidewall 108 of the chamber body 102. The lid 130 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the nozzle 132. The lid 130 may be a ceramic such as $Al_2O_3$, $Y_2O_3$, YAG, $SiO_2$, MN, SiN, SiC, Si—SiC, or a ceramic compound comprising $Y_4Al_2O_9$ and a solid-solution of $Y_2O_3$—$ZrO_2$. The nozzle 132 may also be a ceramic, such as any of those ceramics mentioned for the lid. The lid 130 may include a plasma resistant ceramic coating 133. The nozzle 132 may be coated with a plasma resistant ceramic coating 134.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). A substrate support assembly 148 is disposed in the interior volume 106 of the processing chamber 100 below the lid 130. The substrate support assembly 148 holds a substrate 144 during processing. A ring 146 (e.g., a single ring) may cover a portion of the electrostatic chuck 150, and may protect the covered portion from exposure to plasma during processing. The ring 146 may be silicon or quartz in one embodiment. The ring 146 may include a plasma resistant ceramic coating.

An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116. Additionally, the inner liner 118 may be coated with a plasma resistant ceramic coating.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The electrostatic puck 166 may include a plasma resistant ceramic coating. The thermally conductive base 164 and/or electrostatic puck 166 may include one or more optional embedded heating elements 176, embedded thermal isolators 174 and/or conduits 168, 170 to control a lateral temperature profile of the substrate support assembly 148. The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The heating elements 176 are regulated by a heater power source 178. The conduits 168, 170 and heating elements 176 may be utilized to control the temperature of the thermally conductive base 164, thereby heating and/or cooling the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features that may be formed in an upper surface of the puck 166. The gas passages may be fluidly coupled to a source of a heat transfer (or backside) gas such as He via holes drilled in the puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The at least one clamping electrode 180 (or other electrode disposed in the electrostatic puck 166 or thermally conductive base 164) may further be coupled to one or more RF power sources 184, 186 through a matching circuit 188 for maintaining a plasma formed from process and/or other gases within the processing chamber 100. The RF power sources 184, 186 are generally capable of producing RF signal having a frequency from about 50 kHz to about 3 GHz and a power of up to about 10,000 Watts.

Figure 2:
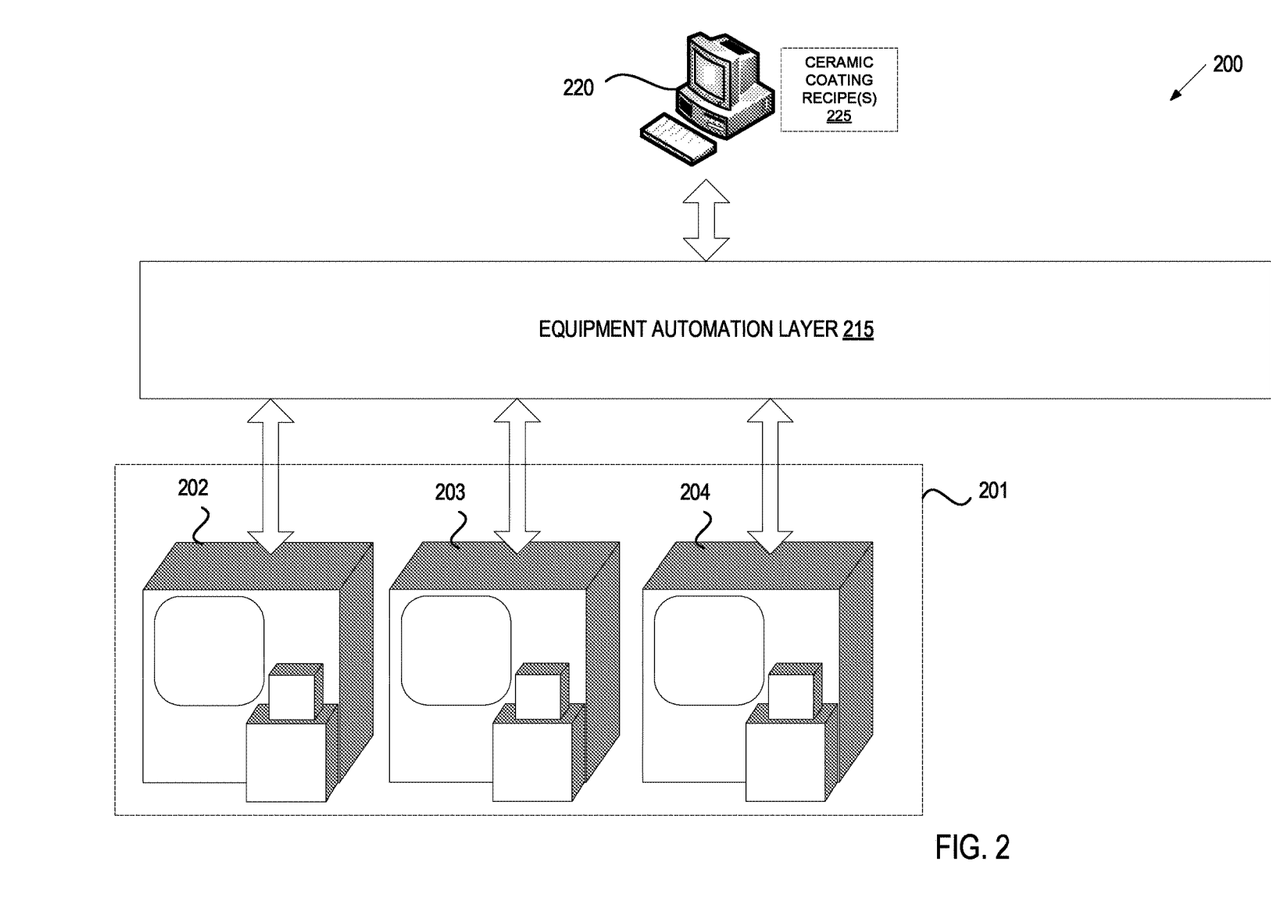
FIG. 2 illustrates an exemplary architecture of a manufacturing system, in accordance with one embodiment of the present invention.

FIG. 2 illustrates an exemplary architecture of a manufacturing system 200. The manufacturing system 200 may be a ceramics manufacturing system. In one embodiment, the manufacturing system 200 includes manufacturing machines 201 (also referred to as processing equipment) connected to an equipment automation layer 215. The manufacturing machines 201 may include a bead blaster 202, one or more wet cleaners 203, and/or a plasma spraying system 204. The manufacturing system 200 may further include one or more computing device 220 connected to the equipment automation layer 215. In alternative embodiments, the manufacturing system 200 may include more or fewer components. For example, the manufacturing system 200 may include manually operated (e.g., off-line) manufacturing machines 201 without the equipment automation layer 215 or the computing device 220.

Bead blaster 202 is a machine configured to roughen the surface of articles such as articles. Bead blaster 202 may be a bead blasting cabinet, a hand held bead blaster, or other type of bead blaster. Bead blaster 202 may roughen a substrate by bombarding the substrate with beads or particles. In one embodiment, bead blaster 202 fires ceramic beads or particles at the substrate. The roughness achieved by the bead blaster 202 may be based on a force used to fire the beads, bead materials, bead sizes, distance of the bead blaster from the substrate, processing duration, and so forth. In one embodiment, the bead blaster uses a range of bead sizes to roughen the ceramic article.

In alternative embodiments, other types of surface rougheners than a bead blaster 202 may be used. For example, a motorized abrasive pad may be used to roughen the surface of ceramic substrates. A sander may rotate or vibrate the abrasive pad while the abrasive pad is pressed against a surface of the article. A roughness achieved by the abrasive pad may depend on an applied pressure, on a vibration or rotation rate and/or on a roughness of the abrasive pad.

Wet cleaners 203 are cleaning apparatuses that clean articles (e.g., articles) using a wet clean process. Wet cleaners 203 include wet baths filled with liquids, in which the substrate is immersed to clean the substrate. Wet cleaners 203 may agitate the wet bath using ultrasonic waves during cleaning to improve a cleaning efficacy. This is referred to herein as sonicating the wet bath.

In other embodiments, alternative types of cleaners such as dry cleaners may be used to clean the articles. Dry cleaners may clean articles by applying heat, by applying gas, by applying plasma, and so forth.

Plasma spraying system 204 is a machine configured to plasma spray a ceramic coating to the surface of a substrate. In one embodiment, plasma spraying system 204 is an atmospheric pressure plasma spraying (APPS) system (also referred to as an air plasma spraying (APS) system). Plasma spraying systems are discussed in greater detail with reference to FIGS. 3-4.

The equipment automation layer 215 may interconnect some or all of the manufacturing machines 201 with computing devices 220, with other manufacturing machines, with metrology tools and/or other devices. The equipment automation layer 215 may include a network (e.g., a location area network (LAN)), routers, gateways, servers, data stores, and so on. Manufacturing machines 201 may connect to the equipment automation layer 215 via a SEMI Equipment Communications Standard/Generic Equipment Model (SECS/GEM) interface, via an Ethernet interface, and/or via other interfaces. In one embodiment, the equipment automation layer 215 enables process data (e.g., data collected by manufacturing machines 201 during a process run) to be stored in a data store (not shown). In an alternative embodiment, the computing device 220 connects directly to one or more of the manufacturing machines 201.

In one embodiment, some or all manufacturing machines 201 include a programmable controller that can load, store and execute process recipes. The programmable controller may control temperature settings, gas and/or vacuum settings, time settings, etc. of manufacturing machines 201. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

In one embodiment, the manufacturing machines 201 are programmed to execute recipes that will cause the manufacturing machines to roughen a substrate, clean a substrate and/or article, coat a article and/or machine (e.g., grind or polish) a article. In one embodiment, the manufacturing machines 201 are programmed to execute recipes that perform operations of a multi-step process for manufacturing a ceramic coated article, as described with reference to FIG. 5. The computing device 220 may store one or more ceramic coating recipes 225 that can be downloaded to the manufacturing machines 201 to cause the manufacturing machines 201 to manufacture ceramic coated articles in accordance with embodiments of the present disclosure.

Figure 3:
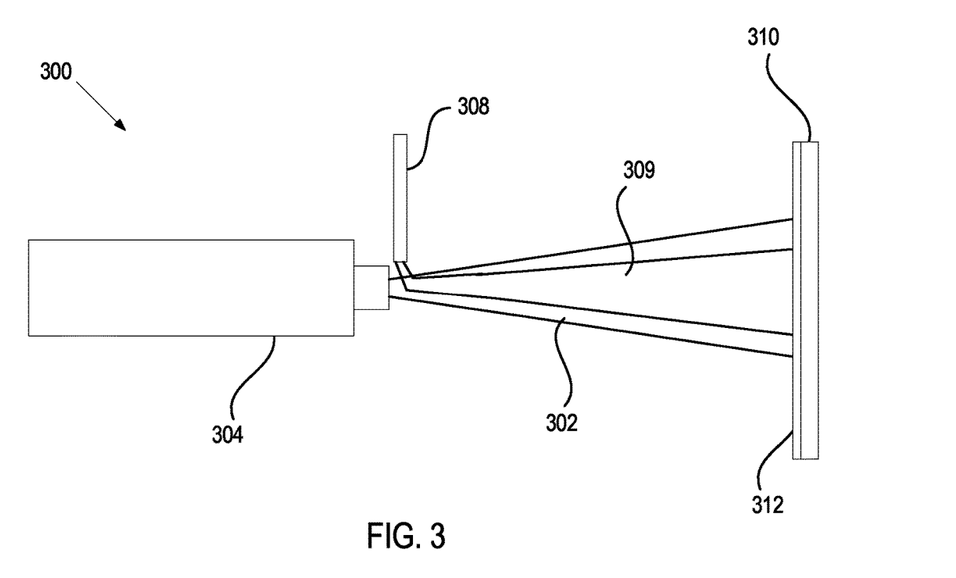
FIGS. 3-4 depict schematics of a plasma spray deposition system.
Figure 4:
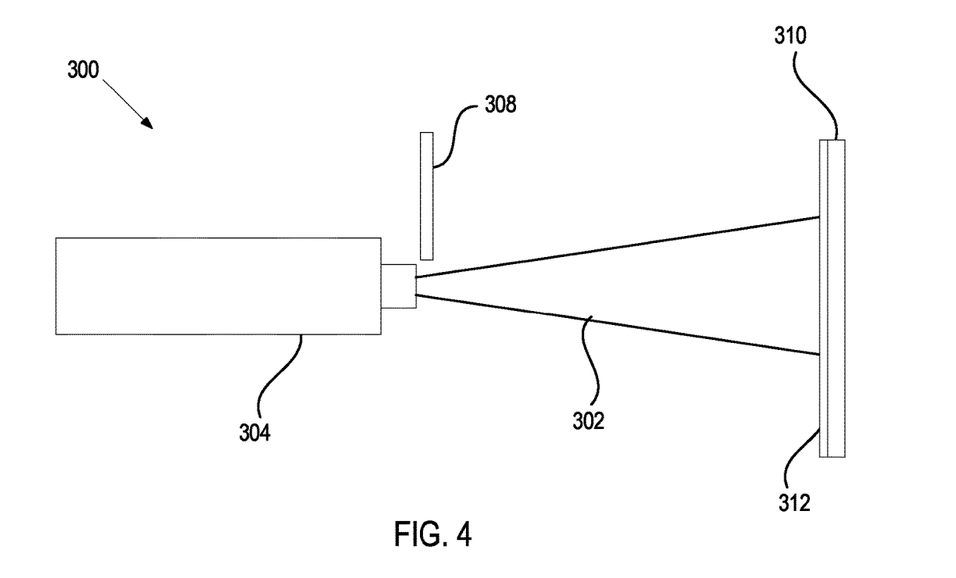

FIGS. 3-4 illustrate a plasma spray system 300 for plasma spraying a plasma resistant ceramic coating on a chamber component, or other article used in a corrosive system. The plasma spray system 300 is a type of thermal spray system. In a plasma spray system, an arc is formed between two electrodes through which a gas is flowing. Examples of gas suitable for use in the plasma spray system 300 include, but are not limited to, Argon/Hydrogen or Argon/Helium. As the gas is heated by the arc, the gas expands and is accelerated through a shaped nozzle of a plasma torch 304, creating a high velocity plasma jet 302.

Powder 309 is injected into the plasma jet 302 by a powder delivery system 308. An intense temperature of the plasma jet 302 melts the powder 309 and propels the molten ceramic material towards an article 310. Upon impacting with the article 310, the molten powder flattens, rapidly solidifies, and forms a ceramic coating 312. The molten powder adheres to the article 310. The parameters that affect the thickness, density, and roughness of the ceramic coating 312 include type of powder, powder size distribution, powder feed rate, plasma gas composition, gas flow rate, energy input, pressure, and torch offset distance.

In one embodiment, the plasma spray system 300 is a conventional atmospheric pressure plasma spray (APPS) system that operates at atmospheric pressure to perform an APPS process. An APPS system does not include any vacuum chamber, and may instead include an open chamber or room. APPS systems produce oxide ceramic coatings having a relatively high porosity. For example, APPS systems may produce ceramic coatings with a porosity of 1-5% in some embodiments. An APPS system may produce ceramic coatings having thicknesses of around 20 microns to several millimeters. For APPS, the ceramic coating bonds to the substrate mainly by mechanical bonding. Accordingly, in one embodiment the article 310 is roughened prior to forming the plasma sprayed ceramic coating 312.

In one embodiment, after the ceramic coating 312 is formed, the powder delivery system 308 may stop feeding ceramic powder into the plasma jet 302, as shown in FIG. 4.

One or more of the plasma gas composition, gas flow rate, energy input, or torch offset distance may additionally be adjusted at this point. Values used for these parameters in some embodiments are represented below in Table 1. The plasma jet 302 may then be used to perform a plasma flame heat treatment of the ceramic coating 312. This plasma flame heat treatment may melt and reflow a surface of the ceramic coating to form a thin crust on the surface of the ceramic coating 312. The thin crust may have a reduced surface roughness, an increased density, and a reduced porosity. A thickness of the crust may be around 1 micron up to about 40 or 50 microns. In one embodiment, the crust has a thickness of about 20-40 microns. Additionally, the plasma flame heat treatment may reduce or eliminate some of all surface cracks of the ceramic coating. This plasma flame heat treatment may also reduce or eliminate loosely bonded particles on the surface of the ceramic coating, and may reduce or eliminate nodules on the surface of the ceramic coating.

Figure 5:
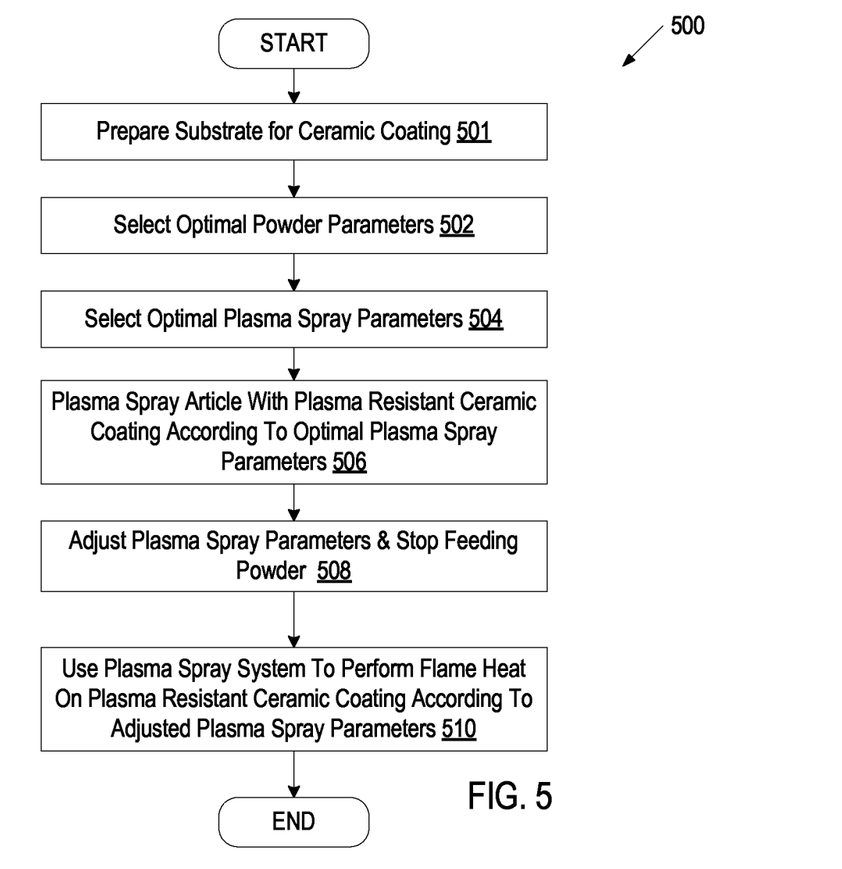
FIG. 5 illustrates one embodiment of a process for forming a plasma sprayed ceramic coating over a chamber component.

FIG. 5 illustrates one embodiment of a process 500 for forming a plasma sprayed ceramic coating over a chamber component. At block 501, a substrate is prepared for coating. The substrate may be a metal substrate such as aluminum, copper, magnesium, or another metal or a metal alloy. The substrate may also be a ceramic substrate, such as alumina, yttria, or another ceramic or a mixture of ceramics. Preparing the substrate may include shaping the substrate to a desired form, grinding, blasting or roughening the substrate to provide a particular surface roughness and/or cleaning the substrate. In one embodiment, the substrate is roughened. This may activate the surface by increasing the free space energy and may strengthen mechanical bonding of the ceramic coating to the substrate.

At block 502, optimal powder characteristics for plasma spraying a ceramic coating are selected. In one embodiment, an optimal powder type and an optimal powder size distribution are selected for the powder. In one embodiment, an optimized agglomerate powder size distribution is selected where 10% of agglomerate powder (D10) has a size of less than 10 μm, 50% of agglomerate powder (D50) has a size of 10-30 μm and 90% of agglomerate powder (D90) has a size of less than 55 μm.

Raw ceramic powders having specified compositions, purity and particle sizes are selected. The ceramic powder may be formed of any of the rare earth oxides previously discussed. The raw ceramic powders are then mixed. These raw ceramic powders may have a purity of 99.9% or greater in one embodiment. The raw ceramic powders may be mixed using, for example, ball milling. The raw ceramic powders may have a powder size of in the range of between about 100 nm-20 μm. In one embodiment, the raw ceramic powders have a powder size of approximately 5 μm.

After the ceramic powders are mixed, they may be calcinated at a specified calcination time and temperature. In one embodiment, a calcination temperature of approximately 1200-2000° C. (e.g., 1400° C. in one embodiment) and a calcination time of approximately 2-5 hours (e.g., 3 hours in one embodiment) is used. The spray dried granular particle size for the mixed powder may have a size distribution of approximately 30 μm in one embodiment.

At block 504, optimal plasma spray parameters are selected. In one embodiment, optimizing plasma spray parameters includes, but is not limited to, setting a plasma gun power and a composition of spray carrier gas.

Optimizing the powder characteristics and the plasma spray parameters may lead to a coating with a decreased porosity and an increased density. Such a decreased porosity and increased density improves protection of a coated article from corrosive elements such as plasmas. Also, fully melted nodules are less likely to break free of the ceramic coating and contaminate the substrate or wafer causing particle problems.

At block 506, the article is coated according to the selected powder characteristics and plasma spray parameters. Plasma spraying techniques may melt materials (e.g., ceramic powders) and spray the melted materials onto the article using the selected parameters. In one embodiment, the plasma sprayed ceramic coating may have a thickness about 200-650 microns.

The plasma spray process may be performed in multiple spray passes. For each pass, the angle of a plasma spray nozzle may change to maintain a relative angle to a surface that is being sprayed. For example, the plasma spray nozzle may be rotated to maintain an angle of approximately 45 degrees to approximately 90 degrees with the surface of the article being sprayed. Each pass may deposit a thickness of up to approximately 25 µm. The plasma sprayed plasma resistant ceramic coating may have a surface roughness of about 160-300 micro-inches.

At block 508, the plasma spray parameters are adjusted and a powder feed rate is reduced to zero. Accordingly, at block 508 the flow of powder into the plasma jet is stopped. The changes to the plasma spray parameters may include changing a plasma power, a torch offset distance, a gun moving speed, and so on.

TABLE 1

Plasma Spray Input Parameters

| Input Parameter | Unit | Coating Range | Heat Treatment Range |
| --- | --- | --- | --- |
| Power of Plasma | kW | 9-300 | 35-300 |
| Gun Current | A | 300-1000 | 500-1000 |
| Gun Voltage | V | 30-300 | 70-300 |
| Powder Feed | g/min. | 5-200 | 0 |
| Distance | mm | 50-200 | 20-100 |
| Gas Flow Rate | L/min. | 30-500 | 50-500 |

Table 1 illustrates input parameter ranges that may be used for coating the article and for performing a plasma flame heat treatment to form a crust on the coating. The parameters include, but are not limited to, power of plasma, gun current, gun voltage, powder feed rate, gun stand-off distance, and gas flow rate.

At block 510, the plasma spray system is used to perform a plasma flame heat treatment on the plasma resistant ceramic coating according to the adjusted plasma spray parameters. The plasma flame heat treatment may be performed for about 0.5-20 minutes in one embodiment. The plasma flame heat treatment may be performed for about 10-15 minutes in another embodiment. The plasma flame heat treatment may cause a surface of the plasma resistant ceramic coating to melt and reflow, which causes a crust to form on a surface of the plasma resistant ceramic coating. This may reduce or eliminate loose particles on the ceramic coating, and may reduce or eliminate partially melted nodules. Both unmelted particles and partially melted nodules can cause contamination during processing. Additionally, the crust may have a higher density and lower porosity than the rest of the plasma resistant ceramic layer. In one embodiment, the crust has a thickness of between about 1 micron and about 40 microns. In one embodiment, the crust has a thickness of less than 20 microns. The crust may have a surface roughness that is approximately 20-25% lower (smoother) than a surface roughness of the plasma resistant ceramic coating prior to the plasma flame heat treatment. In another embodiment, the crust has a thickness of less than 1 micron. The crust may have a surface roughness of about 100-150 micro-inches in one embodiment.

TABLE 2

Plasma Spray Coating Range

| Metric | Units | Optimized Range |
| --- | --- | --- |
| Partially Melted Surface Nodules | % | 5%-20% |
| Surface Roughness | µ-inch | 160-250 |
| HCl Bubble Time | hr | >4 |
| Breakdown Voltage | V/mil | >500 |

Table 2 illustrates measured coating characteristics using the optimized plasma and powder parameters as described above.

Figure 6:
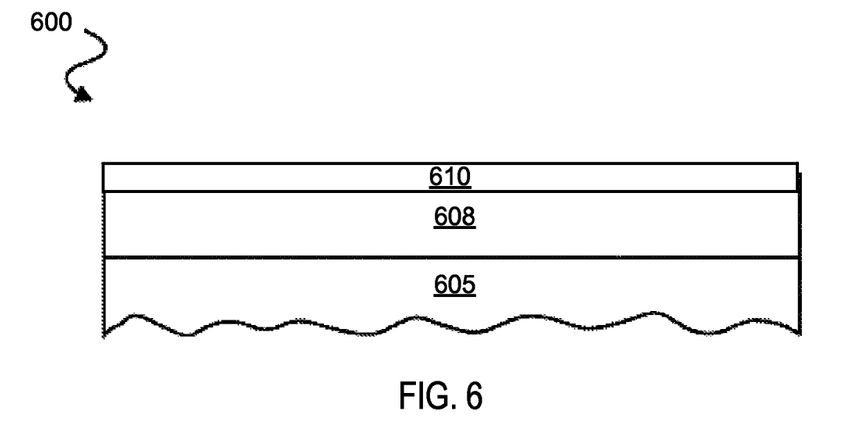
FIG. 6 illustrates a cross sectional side view of an article covered by a plasma sprayed protective layer having a crust formed by a plasma flame heat treatment process.

FIG. 6 illustrates a cross sectional side view of an article (e.g., chamber component) covered by plasma resistant ceramic coating having a crust that has been formed by a plasma flame heat treatment process. A body 605 of the article 600 includes a plasma resistant ceramic coating 608 having a crust 610 that has been formed by a plasma flame heat treatment process. The plasma resistant ceramic coating 608 may have a porosity and cracking. The crust formed by the plasma flame heat treatment may have a lower porosity and fewer cracks. Additionally, the crust may have a lower surface roughness, reduced particles and fewer surface nodules as compared to a plasma resistant ceramic coating that has not been heat treated. The plasma resistant ceramic coating 608 may have a thickness of about 100-500 µm and a porosity of about 1-5%. The crust 610 may have a thickness of about 1-50 microns.

Examples of ceramics that may be used to form the plasma resistant ceramic coating 608 include $Y_3Al_5O_{12}$, $Y_4Al_2O_9$, $Er_2O_3$, $Gd_2O_3$, $Er_3Al_5O_{12}$, $Gd_3Al_5O_{12}$, a ceramic compound comprising $Y_4Al_2O_9$ and a solid-solution of $Y_2O_3$—$ZrO_2$, or any of the other ceramic materials previously identified. Other Er based and/or Gd based plasma resistant rare earth oxides may also be used to form the plasma resistant ceramic coating 608.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:
    feeding a ceramic powder into a plasma spraying system at a powder feed rate of 5-200 grams per minute;
    depositing a plasma resistant ceramic coating on a surface of an article in a plasma spray process by the plasma spraying system, wherein the plasma spray process is performed using a plasma power of 9-300 kW, a gun current of 300-1000 Amps, a gun voltage of 30-300 Volts, the powder feed rate of 5-200 grams per minute, a torch offset distance of 50-200 mm and a gas flow rate of 30-500 Liters per minute, wherein the plasma resistant ceramic coating consists essentially of a material selected from a group consisting of $Er_2O_3$, $Gd_2O_3$, $Er_3Al_5O_{12}$, $Gd_3Al_5O_{12}$, and $Nd_2O_3$, wherein the plasma resistant ceramic coating does not comprise $Y_2O_3$, $Y_3Al_5O_{12}$ or $YF_3$, and wherein the plasma resistant ceramic coating has a thickness of about 100 microns to about 650 microns, has a porosity of 1-5%, has a surface roughness of about 160-250 micro-inches, and comprises a plurality of loosely bonded particles, a plurality of partially melted surface nodules, a plurality of surface cracks and a plurality of pores at the surface of the article;
    reducing the powder feed rate of the ceramic powder to zero grams per minute;
    adjusting at least one of the plasma power, a gun moving speed or the torch offset distance of the plasma spraying system; and
    performing an in-situ plasma flame heat treatment of the plasma resistant ceramic coating by the plasma spraying system to cause a surface of the plasma resistant ceramic coating to melt and reflow to form a crust on the plasma resistant ceramic coating, wherein the in-situ plasma flame heat treatment is performed using 35-300 kW for the plasma power, 500-1000 Amps for the gun current, 70-300 Volts for the gun voltage, 20-100 mm for the torch offset distance and 50-500 Liters per minute for the gas flow rate, wherein the crust has a thickness of above 0 microns to less than about 50 microns, has a porosity that is less than the porosity of the plasma resistant ceramic coating, has a surface roughness of about 100-150 micro-inches, and lacks at least some of the plurality of loosely bonded particles, at least some of the plurality of partially melted surface nodules, at least some of the plurality of surface cracks and at least some of the plurality of pores at the surface of the article.

2. The method of claim 1, wherein the article is a chamber component for a plasma etch reactor, the article comprising at least one of a metal or a sintered ceramic.

3. The method of claim 1, wherein the crust has a thickness of above 0 microns to less than about 20 microns.

4. The method of claim 1, wherein the in-situ plasma flame heat treatment is performed for approximately 0.5-20 minutes.

5. The method of claim 1, wherein the in-situ plasma flame heat treatment is performed for approximately 10-15 minutes.

6. The method of claim 1, wherein the plasma spraying system comprises an atmospheric plasma spraying system.

7. The method of claim 1, wherein the crust has thickness of above 0 microns to less than 1 micron.

8. The method of claim 1, wherein the plasma resistant ceramic coating consists of $Er_2O_3$.

9. The method of claim 1, wherein the plasma resistant ceramic coating consists of $Er_3Al_5O_{12}$.

10. A method, comprising:
    feeding a ceramic powder into a plasma spraying system at a powder feed rate;
    depositing a plasma resistant ceramic coating on a surface of an article in a plasma spray process by the plasma spraying system, wherein the plasma spray process is performed using a first plasma power, a first gun current, a first gun voltage, the powder feed rate, a first torch offset distance and a first gas flow rate, wherein the plasma resistant ceramic coating consists essentially of a material selected from a group consisting of $Er_2O_3$, $Gd_2O_3$, $Er_3Al_5O_{12}$, $Gd_3Al_5O_{12}$, and $Nd_2O_3$, wherein the plasma resistant ceramic coating does not comprise $Y_2O_3$, $Y_3Al_5O_{12}$ or $YF_3$, has a porosity of 1-5%, has a surface roughness of about 160-250 micro-inches, and comprises at least one of a plurality of loosely bonded particles, a plurality of partially melted surface nodules, a plurality of surface cracks or a plurality of pores at the surface of the article;
    reducing the powder feed rate of the ceramic powder to zero grams per minute;
    adjusting at least one of a plasma power, a gun moving speed or a torch offset distance of the plasma spraying system; and
    performing an in-situ plasma flame heat treatment of the plasma resistant ceramic coating by the plasma spraying system to cause a surface of the plasma resistant ceramic coating to melt and reflow to form a crust on the plasma resistant ceramic coating, wherein the in-situ plasma flame heat treatment is performed using a second plasma power, a second gun current, a second gun voltage, a second torch offset distance and a second gas flow rate, wherein the crust has a thickness of above 0 microns to less than about 50 microns, has a porosity that is less than the porosity of the plasma resistant ceramic coating, has a surface roughness of about 100-150 micro-inches, and lacks at least some of the plurality of loosely bonded particles, at least some of the plurality of partially melted surface nodules, at least some of the plurality of surface cracks or at least some of the plurality of pores at the surface of the article.

11. The method of claim 10, wherein the plasma resistant ceramic coating has a thickness of about 100 microns to about 650 microns, and wherein the crust has a thickness of above 0 microns to less than about 20 microns.

12. The method of claim 10, wherein the in-situ plasma flame heat treatment is performed for approximately 0.5-20 minutes, and wherein at least one of:

the second plasma power is different from the first plasma power;

the second gun current is different from the first gun current;

the second gun voltage is different from the first gun voltage;

the second torch offset distance is different from the first torch offset distance; or the second gas flow rate is different from the first gas flow rate.

13. The method of claim 10, wherein the article is a chamber component for a plasma etch reactor, the article comprising at least one of a metal or a sintered ceramic.

14. The method of claim 10, wherein the crust has a thickness of above 0 microns to less than about 20 microns.

15. The method of claim 10, wherein the in-situ plasma flame heat treatment is performed for approximately 0.5-20 minutes.

16. The method of claim 10, wherein the in-situ plasma flame heat treatment is performed for approximately 10-15 minutes.

17. The method of claim 10, wherein the plasma spraying system comprises an atmospheric plasma spraying system.

18. The method of claim 10, wherein the crust has thickness of above 0 microns to less than 1 micron.

19. The method of claim 10, wherein the plasma resistant ceramic coating consists of $Er_2O_3$.

20. The method of claim 10, wherein the plasma resistant ceramic coating consists of $Er_3Al_5O_{12}$.

* * * * *